(12) United States Patent
Polcyn

(10) Patent No.: US 7,856,949 B2
(45) Date of Patent: Dec. 28, 2010

(54) HEAT PIPES AND USE OF HEAT PIPES IN FURNACE EXHAUST

(75) Inventor: Adam D. Polcyn, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 487 days.

(21) Appl. No.: 11/958,574

(22) Filed: Dec. 18, 2007

(65) Prior Publication Data

US 2009/0151920 A1 Jun. 18, 2009

(51) Int. Cl.
F22B 37/06 (2006.01)
(52) U.S. Cl. ............... 122/511; 165/104.26; 165/144; 165/182
(58) Field of Classification Search ........... 122/7 R, 122/367.2, 367.3, 511; 210/180; 432/179, 432/180; 165/104.21, 104.23, 104.24, 104.26, 165/134.1, 144, 179, 182
See application file for complete search history.

(56) References Cited

U.S. PATENT DOCUMENTS

| | | | | | |
|---|---|---|---|---|---|
| 2,677,532 | A | * | 5/1954 | Huet | ............... 165/165 |
| 3,884,292 | A | * | 5/1975 | Pessolano et al. | ...... 165/104.26 |
| 3,941,576 | A | | 3/1976 | Welton, Jr. | |
| 3,981,292 | A | | 9/1976 | Lilly et al. | |
| 4,033,406 | A | | 7/1977 | Basiulis | ............ 165/32 |
| 4,045,197 | A | | 8/1977 | Tsai et al. | |
| 4,092,140 | A | * | 5/1978 | Cerutti et al. | ............ 65/99.3 |
| 4,256,173 | A | | 3/1981 | Tsai et al. | |
| 4,280,554 | A | | 7/1981 | Stockman | ........... 165/11 R |
| 4,282,023 | A | | 8/1981 | Hammel et al. | |
| 4,290,797 | A | | 9/1981 | Rossi | |
| 4,298,370 | A | | 11/1981 | Hammel | |
| 4,319,904 | A | | 3/1982 | Gullett | |
| 4,380,463 | A | | 4/1983 | Matesa | |
| 4,416,325 | A | * | 11/1983 | Barratt et al. | ............... 165/47 |
| 4,541,864 | A | | 9/1985 | Ratschat | ............... 75/41 |
| 4,577,615 | A | * | 3/1986 | Tomlinson | ............ 126/99 A |
| 4,702,225 | A | * | 10/1987 | Heffernan et al. | ....... 126/116 A |
| 5,320,071 | A | * | 6/1994 | Valenti et al. | ............ 122/250 R |
| 5,472,047 | A | * | 12/1995 | Welkey | ............... 165/172 |
| 5,845,610 | A | * | 12/1998 | Hatta et al. | ............... 122/510 |
| 6,267,066 | B1 | * | 7/2001 | Schickling et al. | .......... 110/324 |

(Continued)

FOREIGN PATENT DOCUMENTS

EP 0 235 934 A2 9/1987

(Continued)

OTHER PUBLICATIONS

PCT International Search Report dated Jan. 26, 2009 for International Application No. PCT/US2008/079944 filedOct. 15, 2008.

(Continued)

*Primary Examiner*—Gregory A Wilson
(74) *Attorney, Agent, or Firm*—Andrew C. Siminerio

(57) ABSTRACT

An array of a plurality of heat pipe are mounted in spaced relationship to one another with the hot end of the heat pipes in a heated environment, e.g. the exhaust flue of a furnace, and the cold end outside the furnace. Heat conversion equipment is connected to the cold end of the heat pipes.

18 Claims, 5 Drawing Sheets

U.S. PATENT DOCUMENTS

| | | | |
|---|---|---|---|
| 6,273,186 B1 | 8/2001 | Ognibene et al. | |
| 6,533,929 B2 * | 3/2003 | Binsfeld et al. | 210/180 |
| 6,538,193 B1 | 3/2003 | Fraas | |
| 7,204,061 B2 * | 4/2007 | Terabe et al. | 52/506.02 |
| 2005/0087221 A1 * | 4/2005 | Shah | 136/205 |

FOREIGN PATENT DOCUMENTS

| | | |
|---|---|---|
| EP | 1 026 469 A2 | 8/2000 |
| WO | WO 80/01000 | 5/1980 |

OTHER PUBLICATIONS

Polcyn, Adam D., U.S. Appl. No. 12/031,303, entitled "Use Of Photovoltaics For Waste Heat Recovery," filed Feb. 14, 2008.

Polcyn, Adam D., U.S. Appl. No. 11/958,565, entitled "A Device For Use In A Furnace Exhaust Stream for Thermoelectric Generation" filed Dec. 18, 2007.

* cited by examiner

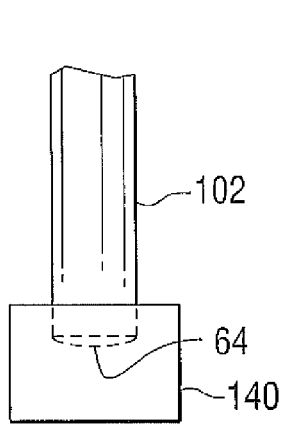
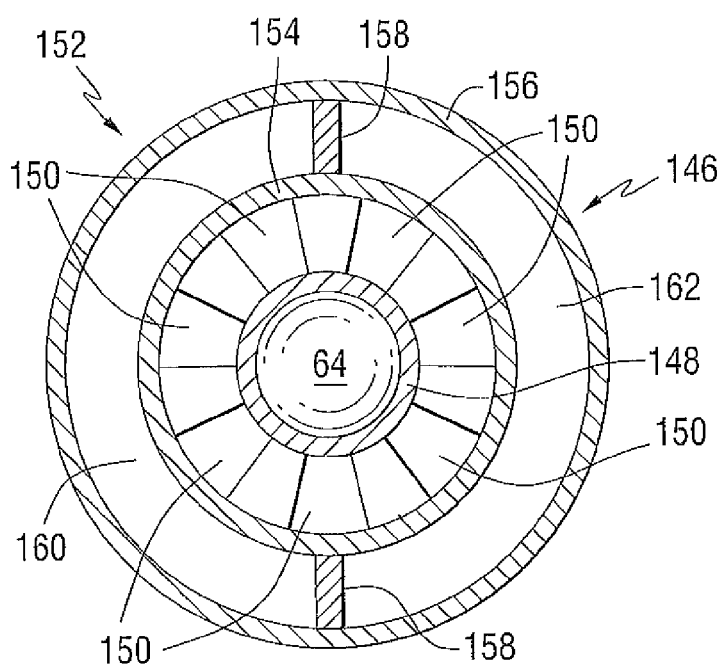
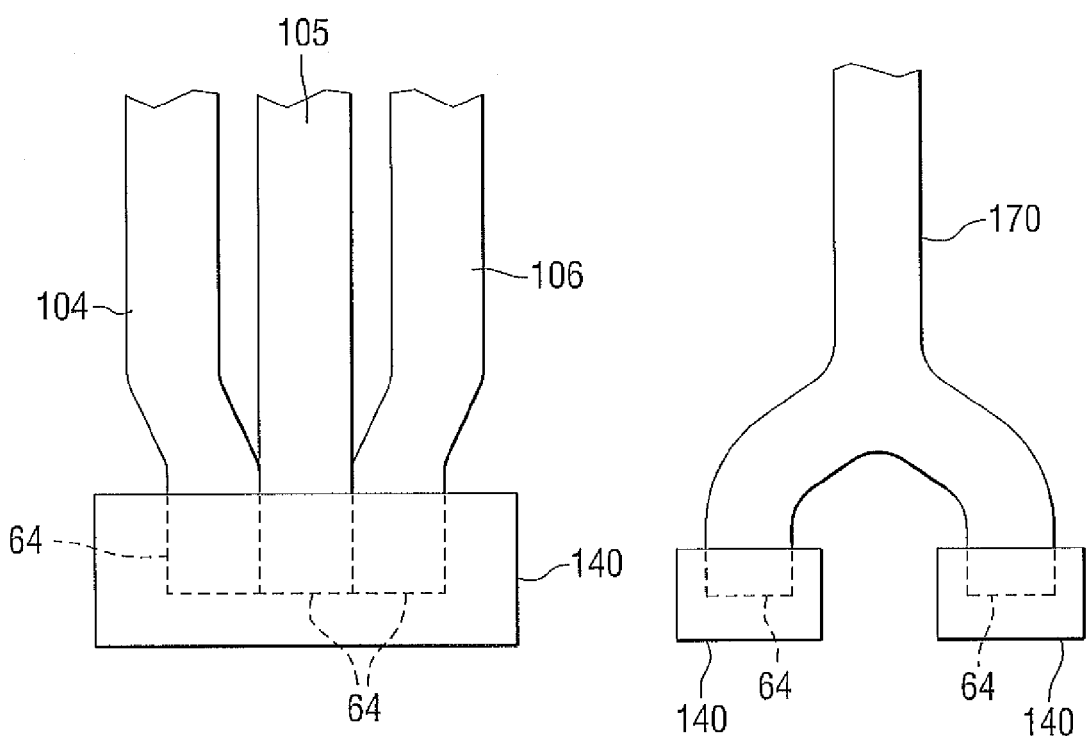

HEAT PIPES AND USE OF HEAT PIPES IN FURNACE EXHAUST

NOTICE OF GOVERNMENT SUPPORT

This invention was made with Government support under Contract No. DE-FC36-04GO14044 awarded by the Department of Energy. The United States government may have certain rights in this invention.

RELATED PATENT APPLICATION

This application is related to U.S. patent application Ser. No. 11/958,565 filed even date in the name of Adam D. Polcyn and titled "A DEVICE FOR USE IN A FURNACE EXHAUST STREAM FOR THERMOELECTRIC GENERATION."

BACKGROUND OF THE INVENTION

1. Field of the Invention

This invention relates to heat pipes and the use of heat pipes in the exhaust of a furnace, e.g. a furnace for melting glass batch materials and homogenizing molten glass, and more particularly, to a heat pipe array mounted in the exhaust flue of a furnace to transfer heat from the exhaust gas moving through the exhaust flue to heat conversion equipment or devices positioned outside the furnace walls to use the heat as is, or to convert the heat to another form of energy, e.g. electrical or mechanical energy.

2. Discussion of the Presently Available Technology

As is appreciated by those skilled in the art, a heat pipe is a device that can transfer heat from one point to another, e.g. transfer heat from a heated environment to a position where the heat is used as is, e.g. to heat an area, or to convert the heat to another form of energy, e.g. electrical or mechanical energy.

Although heat pipes are acceptable for heat transfer, the positioning of the heat pipes in certain heated environments has limitations. One such heated environment is heated exhaust gas having a low-pressure drop and a low gas flow as the exhaust gas moves through the exhaust flue of the furnace. When a heat pipe is positioned in the exhaust flue, the flow rate of the exhaust gases is reduced, which can result in disadvantageous effects on the glass melting process.

As can be appreciated by those skilled in the art, it would be advantageous to position one or more heat pipes in the exhaust flue of a furnace to transfer heat from the exhaust gas to heat conversion equipment or devices positioned outside the furnace wall, while not adversely disturbing the thermal equilibrium of the heating chamber of the furnace.

SUMMARY OF THE INVENTION

This invention relates to an arrangement for transferring heat from a first position located in a passageway defined by inner surface of a wall, e.g. the exhaust flue of a furnace to a second position located adjacent outer surface of the wall. The arrangement includes, among other things, an array of a plurality of elongated heat pipes mounted in the wall, each of the heat pipes having a first end in the first position and an opposite second end in the second position.

This invention further relates to a heat transfer device, including, among other things, a heat pipe; a plurality of spaced elongated heat absorbing members having one end mounted to outer surface of the heat pipe and extending outwardly from the outer surface of the heat pipe.

The invention still further relates to a method of transferring heat from exhaust system of a furnace to a position outside of the exhaust system, includes, among other things, mounting an array of a plurality of heat pipes in a furnace wall with one end of the array in the exhaust system and the opposite second end of the array outside the exhaust system; moving exhaust gases through the exhaust system and over the array to heat the second end of the array, and removing heat from the second end of the array.

BRIEF DESCRIPTION OF THE DRAWINGS

FIG. 12 is an elevated top view of a cold end of a heat pipe showing heat conversion equipment mounted on the cold end of a heat pipe.

FIG. 13 is a cross sectional view side showing the interior of a thermoelectric device, the device can be used in the practice of the invention.

FIG. 14 is an elevated top view showing heat conversion equipment mounted on the cold end of three heat pipes in accordance to the teachings of the invention.

FIG. 15 is an elevated plane view of a heat pipe having two cold ends.

DESCRIPTION OF THE INVENTION

Figure 1:
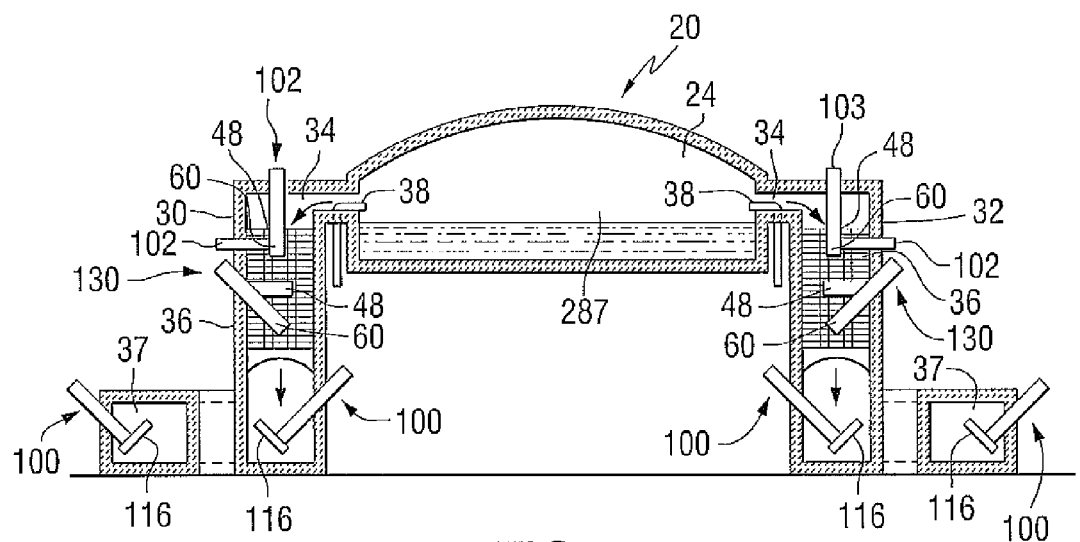
FIG. 1 is a schematic vertical section across the width of a cross-fired, regenerative furnace for melting glass batch materials, the furnace having devices of the invention mounted through the walls of the furnace.

As used herein, spatial or directional terms, such as "inner", "outer", "left", "right", "up", "down", "horizontal", "vertical", and the like, relate to the invention as it is shown in the drawing figures. However, it is to be understood that the invention can assume various alternative orientations and, accordingly, such terms are not to be considered as limiting. Further, all numbers expressing dimensions, physical characteristics, and so forth, used in the specification and claims are to be understood as being modified in all instances by the term "about". Accordingly, unless indicated to the contrary, the numerical values set forth in the following specification and claims can vary depending upon the desired property is sought to be obtained by the present invention. At the very least, and not as an attempt to limit the application of the doctrine of equivalents to the scope of the claims, each numerical parameter should at least be construed in light of the number of reported significant digits and by applying ordinary rounding techniques. Moreover, all ranges disclosed herein are to be understood to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 6.7, or 3.2 to 8.1, or 5.5 to 10. Also, as used herein, the terms "mounted over", "positioned over", or "provided over" mean mounted, positioned, or provided on but not necessarily in surface contact with. For example, one article "provided over" another article does not preclude the presence of materials of between the articles.

Before discussing several non-limiting embodiments of the invention, it is understood that the invention is not limited in its application to the details of the particular non-limiting embodiments shown and discussed herein since the invention is capable of other embodiments. Further, the terminology used herein to discuss the invention is for the purpose of description and is not of limitation. Still further, unless indicated otherwise, in the following discussion like numbers refer to like elements.

In the following discussion, non-limiting embodiments of the invention are discussed for use with a furnace for melting grass batch materials and/or homogenizing molten glass, however, as will be appreciated, the invention is not limited thereto and it is understood that while furnaces for heating particular materials are being described as illustrative examples, the invention is not limited thereto and can be used on any type of furnace to heat any type of material, e.g. but not limited to, a glass forming chamber of the type used in the art to make float glass; furnaces for refining ores to metals; furnaces for changing physical properties of materials, e.g. but not limited to annealing glass and metals; furnaces for making plastics, and furnaces for burning any type of materials, e.g. but not limited to wood, coal and gas.

Figure 2:
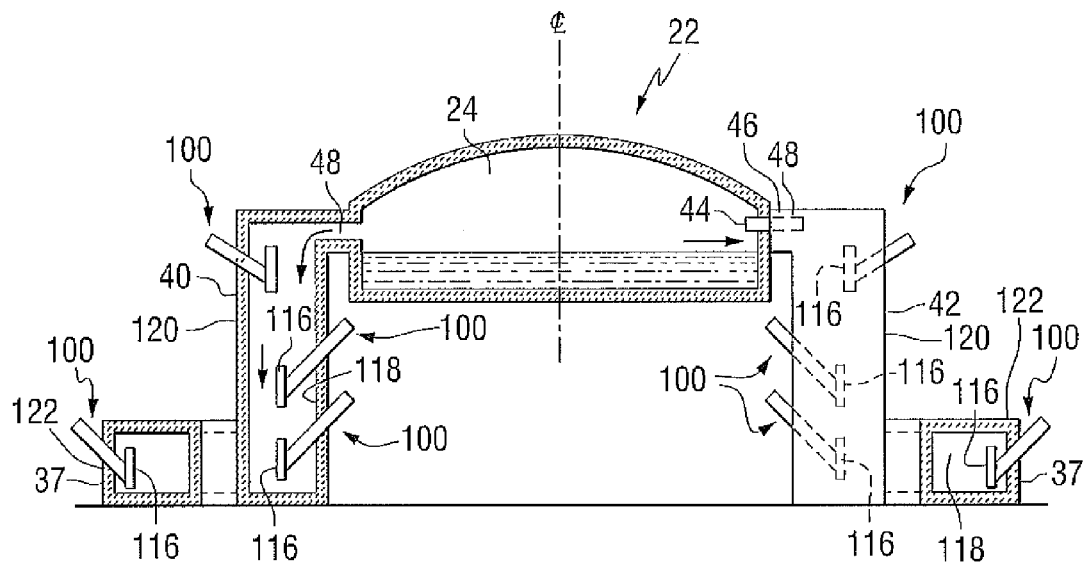
FIG. 2 is a schematic vertical step section across the width of an oxygen fired furnace for melting glass batch materials, the side to the left of the center line ("CL") in FIG. 2 is a cross sectional side view of the exhaust flue, and the side to the right of CL in FIG. 2 is a cross sectional side view of the furnace between the exhaust flues.

Shown in FIGS. 1 and 2 are types of furnaces generally used to melt glass batch materials and to homogenize molten glass. Furnace 20 shown in FIG. 1 is known in the art as a regenerative or Siemens furnace and is similar to FIG. 1A of U.S. Pat. No. 4,256,173, and furnace 22 shown in FIG. 2 is known in the art is a regenerative furnace converted to an oxygen fired furnace. With reference to FIG. 1, glass batch materials of the type used in the art to make float glass are melted in the heating chamber 24 of the furnace 20. Regenerators 30 and 32 go through a cycle including a firing period and a non-firing period to melt the glass batch materials. More particularly, when the regenerators on one side of the heating chamber 24, e.g. the regenerators 30 are in their firing period, the regenerators on the opposite side of the heating chamber 24, e.g. the regenerators 32 are in their non-firing period, and when the regenerators 30 are in their non-firing period, the regenerators 32 are in their firing period. During the non-firing period, heated exhaust gases from the heating chamber 24 move through ports 34, through checkers 36 in the regenerators and out through the remaining part of the flue system of the regenerators, e.g. bypass flue 37 that are in the non-firing period. As the exhaust gases move over the checkers 36, the checkers are heated and the exhaust gases are cooled.

During the firing period, combustion gas, e.g. air is moved through the regenerators in the firing period, through the checkers 36 to heat the combustion gas, and through the ports 34. As the combustion gas moves through the ports 34, it mixes with fuel from nozzles 38. The mixture is ignited and the flame of the ignited mixture is directed into the heating chamber 24 toward the ports 34 of the regenerators in the non-firing period to melt the glass batch materials. For a more detailed discussion of the operation of a regenerative furnace of the type shown in FIG. 1, reference can be made to U.S. Pat. No. 4,256,173, which patent is hereby incorporated by reference.

With reference to FIG. 2, the oxygen-fired furnace 22 shown in FIG. 2 is a regenerative furnace, e.g. of the type shown in FIG. 1 modified to be an oxygen fired furnace with the modifications of interest to this discussion including the absence of checkers 36 from the regenerators 30 and 32 to provide exhaust flues 40 and 42 (absence of the checkers 36 from the flues 40 and 42 clearly shown for the exhaust flue 40 shown on the left side of FIG. 2), and mounting fuel nozzles 44 through furnace wall 46 as shown at the right side of FIG. 2 at a position between ports 48 of the oxygen fired furnace. In the operation of the oxygen fired furnace 22, oxygen and fuel are mixed and fired from the position of the nozzles 44 (only one shown in FIG. 2). The flame of the ignited mixture is directed into the heating chamber 24 of the furnace 22 to melt the glass batch materials. The exhaust from the heating chamber 24 moves through the ports 48 at each side of the heating chamber 24 of the furnace 22 and simultaneously through both of the exhaust flues 40 and 42, and the secondary flues 37.

As can be appreciated, the operation of the oxygen fired furnace 22 is a static process because there is no cycling between a firing period and a non-firing period. Further, the absence of the checkers 36, removes a heat sink providing for more of the heat in the exhaust to heat the heat pipe arrangement of the invention to be discussed in detail below. In the following discussion, the invention will be discussed for use on the oxygen fired furnace 22 with the understanding that the invention is not limited thereto and can be practiced on regenerative furnaces or any other type of furnace. Further, it is understood that the invention is not limited to the design of the oxygen fired furnace and any of the designs of oxygen fired furnaces known in the art can be used in the practice of the invention.

Figure 3:
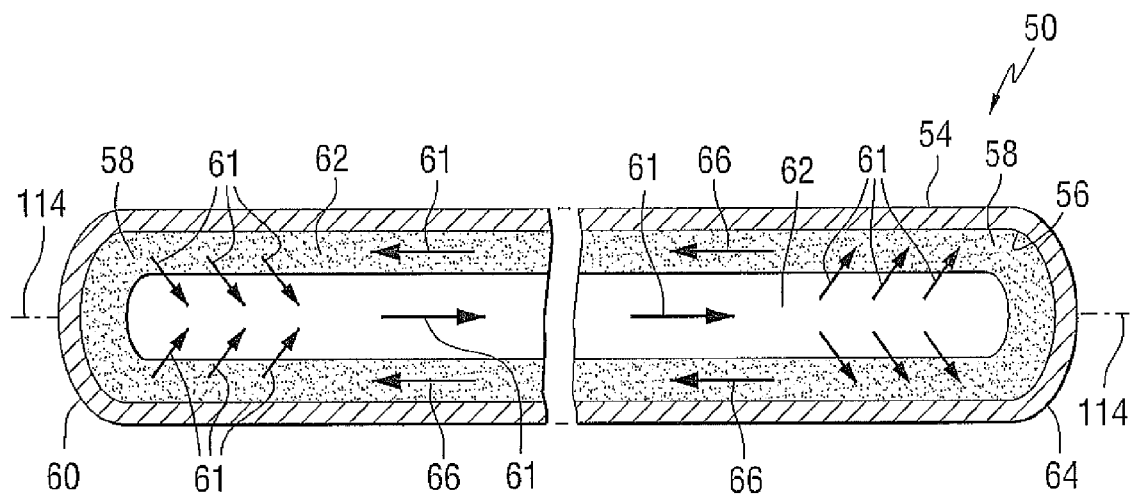
FIG. 3 is an elevated cross sectional side view of a heat pipe that can be used in the practice of the invention.

For a full appreciation of the invention, the discussion will now be directed to the operation of a heat pipe. With reference to FIG. 3 and not limiting to the invention, heat pipe 50 is a closed evaporator-condenser system including a sealed, hollow metal casing 54 whose inside walls 56 are lined with a capillary structure or wick 58. Thermodynamic working fluid, with substantial vapor pressure at the temperature at which the heat pipe 50 is exposed, saturates the pores of the wick 58 in a state of equilibrium between liquid and vapor. When heat e.g. the heated exhaust gases of the furnace 20 and/or 22 is applied to a portion of the heat pipe 50 e.g. to end portion 60 or the portion of the heat pipe in the exhaust flue, the liquid in the wick 58 heats and evaporates. As the evaporating fluid designated by the arrows 61 fills vapor cavity 62, it moves along the vapor cavity 62 to opposite end 64 of the casing 54 where heat loss results in condensation of the vapor. This effective high thermal conductance helps maintain near constant temperatures along the entire length of the heat pipe 50.

The vapor condenses back to fluid giving up heat and the fluid is absorbed by the wick 58 releasing thermal energy. Condensation of the vapor occurs wherever the temperature is even slightly below that of the evaporation area, e.g. the temperature of the heated end 60 of the heat pipe 50, or the temperature of the portion of the heat pipe in the exhaust flue. Attaching a heat sink to a portion of the heat pipe 50, e.g. the end 64 makes condensation take peace at this point of heat transfer and establishes a vapor flow pattern. As the vapor condenses, the vapor gives up the heat it acquired during evaporation. Capillary action within the wick 58 returns the condensate shown as arrows 66 to the heated end 60 of the heat pipe 50 and completes the operating cycle.

The heat pipe 50 shown in FIG. 2 is known in the art as a Perkins tube, the invention however is not limited to the type of heat pipe used in the practice of the invention, and any of the types known in the art can be used in the practice of the invention. As is known in the art, the thermodynamic working liquid is selected depending on the temperature to which the heat pipe is exposed. In general, the temperature at the port 48 is about 2925° F. (1663° C.); the temperature at the downstream end of the flues 40 and 42 is about 1100° F. (593° C.), and the temperature of the exhaust entering the bypass flue 37 is about 700° F. (371° C.). Table 1 below lists several known thermodynamic working liquids and their useful range of temperatures.

TABLE 1

| THERMODYNAMIC WORKING FLUIDS | MELTING PT. (° C.) | BOILING PT. AT ATM. PRESSURE | USEFUL RANGE (° C.) |
|---|---|---|---|
| Water | 0 | 100 | 30 to 200 |
| Toluene | −95 | 110 | 50 to 200 |
| Mercury | −39 | 361 | 250 to 650 |
| Potassium | 63 | 759 | 400 to 950 |
| Sodium | 98 | 892 | 600 to 1200 |
| Lithium | 179 | 1340 | 1000 to 1800 |
| Silver | 960 | 2212 | 1800 to 2300 |

Heat pipes are well known in the art, and further discussion of the operation of heat pipes and types of heat pipes available is not deemed necessary.

The discussion is now directed to non-limiting embodiments of the invention. In one non-limiting embodiment of the invention, heat pipe arrangement 100 shown in FIGS. 4 and 5 includes a plurality of heat pipes 102-113 arranged in an array 115, and optionally the heated end 60 of the heat pipes 102-113 of the array 115 are secured to a plate 116 having a high thermal conductivity, e.g. a refractory material, or a metal such as aluminum, stainless steel or inconel 601. As can be appreciated by those skilled in the art, the material selected for the plate 115 should be compatible with the temperature of the environment in which the arrangement 100 is placed. For example and not limiting to the invention, aluminum has a melting point of about 1220° F. (660° C.), and an arrangement 100 having an aluminum plate 116 should be placed in environments having temperatures below 1112° F. (600° C.), e.g. but not limiting to the invention, at the downstream end of the flues 40 and 42. Further the mechanical rigidity of stainless steel starts to drop above 1472° F. (800° C.), and an arrangement 100 having a stainless steel plate 116 should be placed in environments having temperatures below 1472° F. (800° C.), e.g. but not limiting to the invention, at the downstream end of the flues 40 and 42. Still further, inconel 601 has a melting point of 2460° F. (1348° C.), and an arrangement 100 having an inconel 601 plate 116 should be placed in environments having temperatures below 2460° F. (1348° C.), e.g. but not limiting to the invention, downstream of the ports 48.

Figure 6:
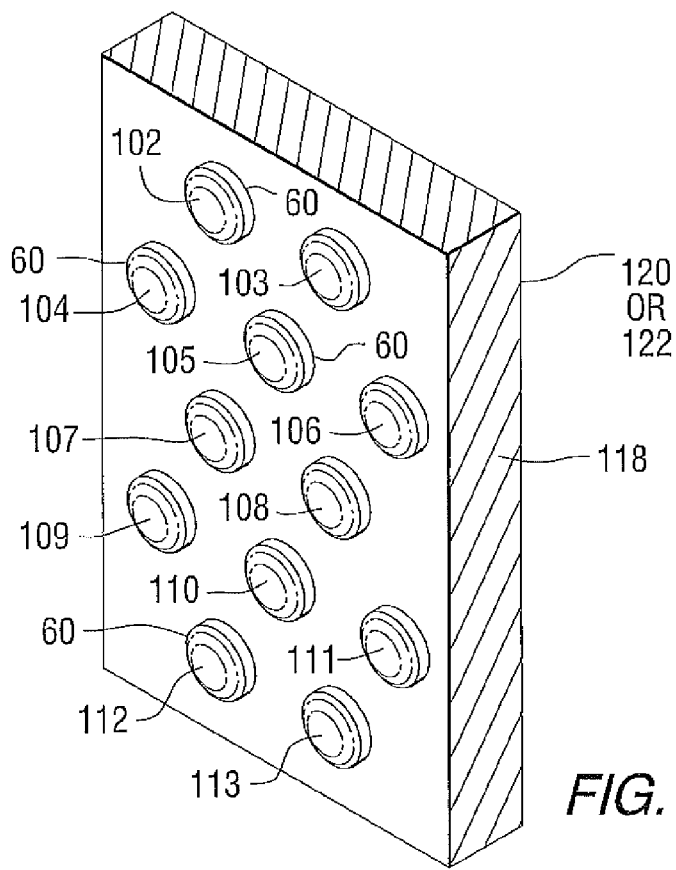
FIG. 6 is a partial view of a furnace wall having the array of the plurality of heat pipes shown in FIG. 4 mounted in the furnace wall in accordance to the teachings of the invention.

For a full appreciation of the invention, the discussion will be directed to the array 115, or the plurality of heat pipes 102-113, without the plate 116. The heat pipes 102-113 of the array 115 are individually mounted in wall 120 of the flues 40 and 42 and/or the wall 122 of the bypass flue 37 with the end 60 of the heat pipes 102-113 in the flues 37, 40 and 42, and the ends 64 of the heat pipes 102-113 outside of the furnace walls 120 and 122 (see FIG. 6). The heat pipes can be mounted in the walls 120 and 122 of the furnace with longitudinal center line 114 shown only in FIG. 3) of the heat pipes generally normal to internal surface 118 of the refractory wall (see FIG. 2), or at an acute angle to the internal surface of the refractory wall with the end 60 of the heat pipes outside the furnace above the heated end 64 of the heat pipes. As is appreciated by those skilled in the art, mounting the heat pipes at the acute angle provides for the force of gravity in addition to the action of the wick of the heat pipes to flow the condensate from the end 64 to the end 60 of the heat pipes as discussed above.

Figure 4:
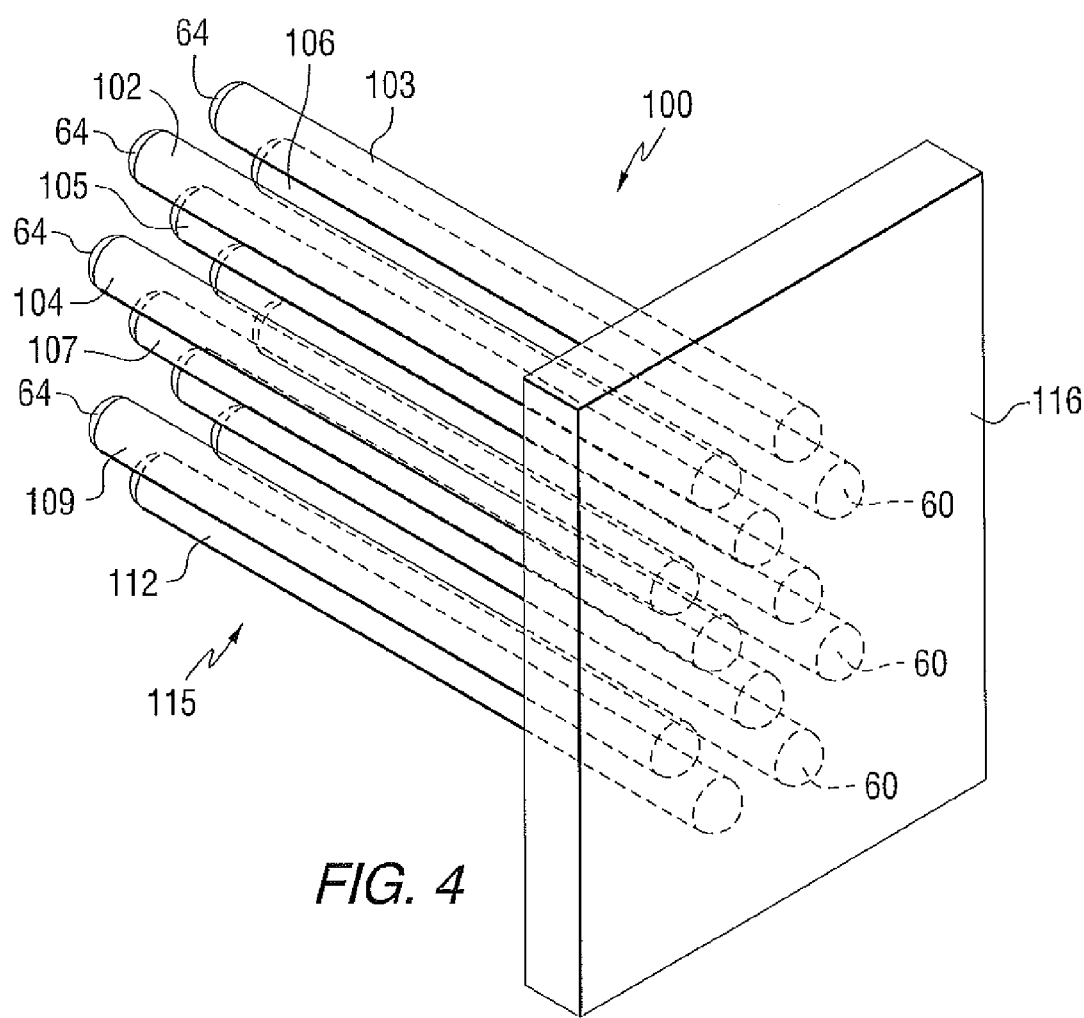
FIG. 4 is an elevated isometric side-back view of an array of a plurality of heat pipes incorporating features of the invention.
Figure 5:
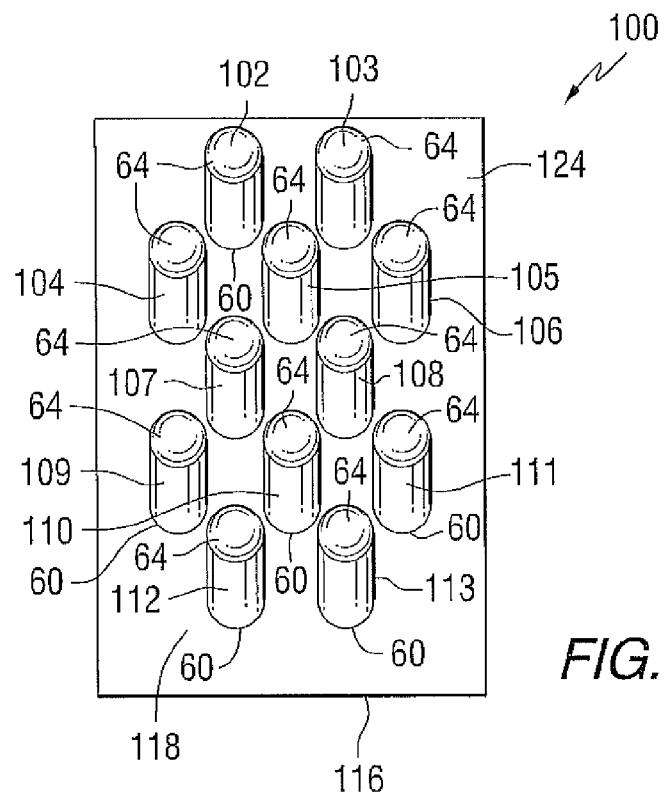
FIG. 5 is an elevated front view of the array of the plurality of heat pipes shown in FIG. 4.

The array 115 shown in FIGS. 4 and 5, has 12 heat pipes arranged in 5 rows and 4 columns with the heat pipes 102-103, 107-108 and 112-113 in the rows 1, 3 and 5, respectively, off set from the heat pipes 104-106 and 109-111 in the rows 2 and 4, respectively. The invention contemplates the array 115 of the invention having more or less than 12 heat pipes, and the heat pipes in the columns and rows aligned with one another. The plurality of heat pipes 102-113 are arranged in the array 115 to simulate a pin fin array to more efficiently remove heat from the heated exhaust gases flowing through the flues 40 and 42. Pin fin arrays for heat transfer are well known in the art, e.g. a particular pin fin array for heat transfer from electronic systems is disclosed in U.S. Pat. No. 6,273,186, and no further discussion regarding pin fin arrays is deemed necessary.

As is appreciated by those skilled in the art, the heated exhaust gases moving through the exhaust flues of an oxygen fired furnace have a low pressure drop and a low gas flow, therefore care has to be exercised when mounting the array 115 of heat pipes in the exhaust flue that the flow of the exhaust gases moving through the flue is not greatly impeded. Impeding the flow of the exhaust gases from the heating chamber 24 can over heat the heating chamber 24 causing damage to the furnace and/or adversely affecting the quality of the finished product. In view of the forgoing, in the preferred practice of the invention, but not limiting to the invention, the array 115 of heat pipes should not block exhaust gases or impede the flow of the exhaust to the extent that the furnace is damaged and/or the quality of the finished product is adversely effected. As is appreciated by those skilled in the art, the amount of blockage of the exhaust gases before adversely effecting the operation of a furnace varies, and therefore, the amount of blockage experienced by the array of the invention is not limiting to the invention.

Parameters to consider when determining the blockage of the array 115 of heat pipes 102-113 are (1) the outside diameter of the heat pipes; (2) the center to center spacing of the heat pipes in a row; (3) the number of heat pipes in a row; (4) the center to center spacing of heat pipes in a column; (5) the number of heat pipes in a column, the length of the heat pipes, and (6) the misalignment of heat pipes between adjacent rows, i.e. the portion of the spacing between heat pipes in a top row covered by a heat pipe in the adjacent bottom row. As the outside diameter of the heat pipes increases, while the remaining parameters are kept constant, the blockage percent increases and vise versa. As the center to center spacing of the heat pipes in a row increases, while the remaining parameters are kept constant, the blockage percent decreases and vise versa. As the number of heat pipes in a row increases, the blockage percent increases and vise versa. As the center to center spacing of heat pipes in a column increases while the remaining parameters are kept constant, the blockage percent decreases and vise versa. As the number of heat pipes in a column increases, while the remaining parameters remain constant, the blockage percent increases and vise versa. As the length of the heat pipes increases, while the remaining parameters are kept constant, the blockage percent increases and vise versa. As the misalignment of heat pipes in adjacent rows increases, while the remaining parameters remain constant, the blockage percent increases and vise versa.

As can be appreciated, the invention is not limited to the parameters, or the effect of the parameters discussed above, which are presented for a better appreciation of the invention, but are not limiting to the invention. Further as is appreciated by those skilled in the art, other parameters can be considered to determine the blockage of the array 115 of the invention.

As can now be appreciated, as the misalignment of heat pipes in adjacent rows increases, the exhaust gases experience an increase in turbulence, which can increase the transfer of heat from the exhaust gas to the heat pipe. The down side of increasing the misalignment of heat pipes in adjacent rows is a decrease in pressure drop, which reduces the gas flow through the heat pipe array 115. Further as the misalignment of the heat pipes in adjacent rows decreases, there is less turbulence, and reduction in the gas pressure drop through the array 115.

The invention is not limited to the number of rows, columns, or heat pipes in a row and/or column, in the array 115. In another non-limiting embodiment of the invention, the array 115 includes heat pipes having an outside diameter of 3 inches (7.62 centimeter ("cm")); the array 115 having 5 rows and 5 columns of heat pipes, each row having 4 heat pipes with the heat pipes on a center to center spacing of about 3.5 inches (8.89 cm), and each column having 4 heat pipes on a center to center spacing of 3.5 inches (8.89 cm). In general, any particles carried in the exhaust gases can accumulate on the outer surface of the heat pipes forming a heat insulating blanket on the outer surface of the heat pipes. In the preferred practice of the invention, the spacing between the heat pipes is not less than ⅟16 inch (0.16 centimeter) to avoid trapping particles between the heat pipes of the array.

In another non-limiting embodiment of the invention, the array 115 of heat pipes 102-113 has the plate 116 attached to the end 60 in any convenient manner, e.g. by welding; mechanical fasteners, e.g. but not limited to a thread shaft on the end 60 of the heat pipe extending through a hole in the plate to receive a nut, and/or an adhesive. The plate 116 in addition to acting as a heat sink also provides support for keeping the ends 60 of the heat pipes aligned with one another. The invention is not limited to the angle subtended by the longitudinal center line of the heat pipes and surface 124 of the plate, or to the angle subtended by the direction of the flow of the exhaust gases and the surface 124 of the plate 116. The surface 124 of the plate 116 can be parallel to the flow of the exhaust gases or can be at an acute angle to the flow of the exhaust gases. When the plate is parallel to the direction of flow of the exhaust gases there is minimal if any blockage of the exhaust flue. As the angle subtended by the direction of the flow of the exhaust gases and the surface 124 of the plate 116 increases, the blockage of the exhaust flue and the exhaust gases increases.

Figure 7:
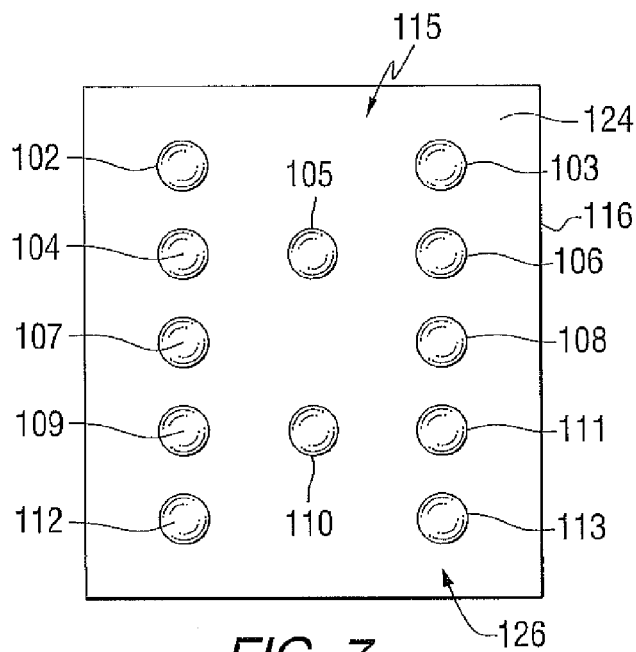
FIG. 7 is an elevated front view of another non-limiting embodiment of an array of a plurality of heat pipes.

Shown in FIG. 7 is another non-limiting embodiment of an arrangement of the invention identified by the number 126. The arrangement 126 includes the array 115 of the plurality of heat pipes 102-113 to have two outer rows, with one outer row having heat pipes 102, 104, 107, 109 and 112 aligned in a vertical line, and the other outer column having heat pipes 103, 106, 108, 111 and 113 aligned with one another and center column having heat pipe 105 in the second row, and the heat pipe 110 in the fourth row with the heat pipes 105 and 110 aligned with one another. Providing the voids in the center column by the absence of heat pipes, reduces the pressure drop through the array 126. In still another non-limiting embodiment of the invention, the plate 116 is secured to the heated end 64 of the heat pipes 102-113 of the array 126 with the longitudinal center line 114 of the heat pipes normal to the surface 124 of the plate 116. The arrangement 126 is positioned in the exhaust flues 37, 40 and/or 42 with the surface 124 of the plate 116 parallel to the direction of the exhaust flow, and with the absence of the plate, with the longitudinal center line 114 of the heat pipes 102-113 normal to the to the exhaust flow.

Figure 8:
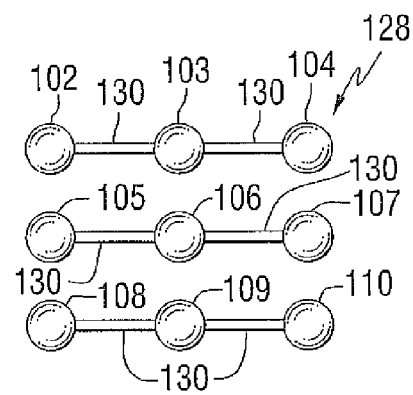
FIG. 8 is an elevated end view of still another non-limiting embodiment of an array of a plurality of heat pipes.
Figure 9:
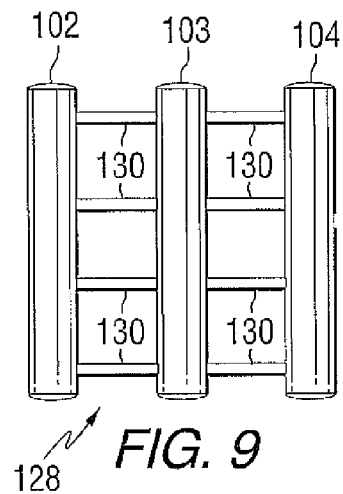
FIG. 9 is a top view of the array of a plurality of heat pipes shown in FIG. 8.

Shown in FIGS. 8 and 9 is still another non-limiting embodiment of an array of heat pipes of the invention identified by the number 128. The array 128 includes the heat pipes 102-110 having three rows and three columns each having 3 heat pipes. The heat pipes in the rows are interconnected by a plurality of spaced heat conducting strips 130, e.g. but not limiting to the invention, metal strips 130. The strips 130 act as a pin fin array between the heat pipes to increase the transfer of heat from the exhaust gases to the heat pipes.

The array 115 (see FIGS. 4-7) and 128 (see FIGS. 8 and 9) of heat pipes with or without the plate 116 is positioned in the exhaust flues 40 and/or 42, and/or the secondary flue 37 of the furnace 22 (see FIG. 2) with the ends 64 of the heat pipes 102-113 extending out of walls 120 and/or 122 of the furnace 22 and the center line 114 of the heat pipes horizontally level, or the end 64 of the heat pipes outside the furnace walls above the heated end 60 of the heat pipes. Preferably the end 64 is above the heated end 60 of the heat pipes for the condensed vapor by the action of the wick 66 of the heat pipe (see FIG. 3) and to move under the force of gravity to the heated end 64, as discussed above. The invention is not limited to the manner in which the heat pipes of the array of the invention are positioned in the walls of the furnace 22. For example and not limiting to the invention, holes can be drilled in the walls of the furnace and the heat pipes inserted into the holes, or a portion of the furnace wall can be removed and the furnace wall rebuilt around an array of heat pipes of the invention.

Figure 10:
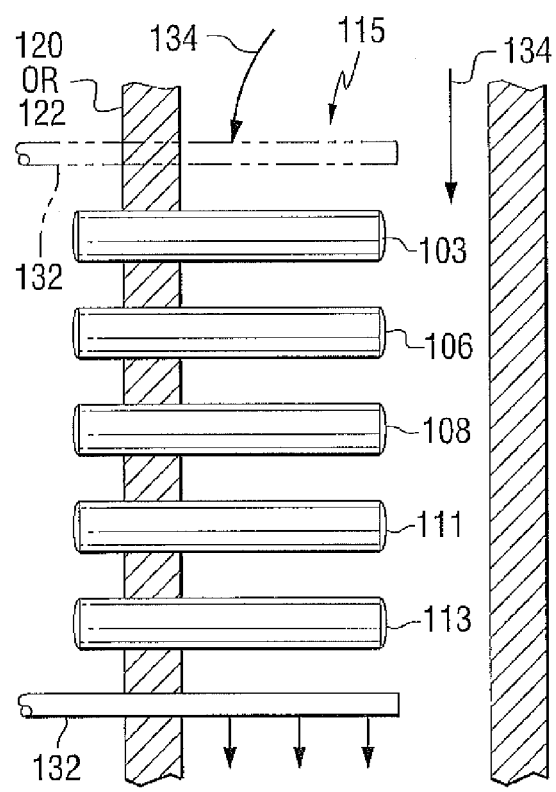
FIG. 10 is a cross sectional side view of a furnace flue incorporating features of the invention.

With reference to FIG. 10, in another non-limiting embodiment of the invention, the flow of the exhaust gas through the array of heat pipes, e.g. the array 115 is enhanced by providing one or more air conduits 132 below the array 115. The flow of the exhaust gas through the array 115 is increased by moving air through the conduit 132 in the direction of the flow (designated by the arrows 134) of the exhaust gases. As can be appreciated the conduits can be provided above and/or below the array 126 (the conduit 132 above the array 126 shown in phantom in FIG. 10). In the practice of the invention hot air is moved through the conduit 132 above the array 126 to reduce cooling of the exhaust gases, and hot or cold air is moved through the conduit 132 below the array 126. In the preferred practice of the invention, air is moved through the conduit 132 below the array 126. As can be appreciated, instead of moving air through the conduits 132, or in combination with moving air through the conduits 132, a fan can be mounted in the exhaust flue of the furnace downstream of the array 126 to pull the exhaust gases through the array 126. The art of mounting fans in the exhaust flue of furnaces is known in the art, and no further discussion is deemed necessary.

Although the discussion was directed to an array having a plurality of heat pipes, the invention contemplates inserting a plurality of single pipes with or without the plate 116 in the exhaust flue of the furnace. In a preferred practice of the invention, the single heat pipe can have the thermal conducting strips 130 on each side as shown for the heat pipe 103 in FIG. 9.

Figure 11:
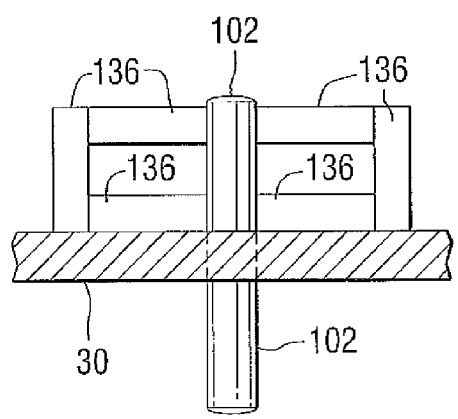
FIG. 11 is a top view of a checker arrangement incorporating features of the invention.

Consider now, the practice of the invention in the portion of the regenerators having the checkers 36. With reference to FIG. 11, in one none limiting embodiment of the invention, a heat pipe, e.g. the heat pipe 102 is included in a layer of refractory bricks 136 that forms a layer of the checkers 36. In another non-limiting embodiment of the invention, a heat pipe, e.g. the heat pipe 103 is inserted into the opening formed by the bricks of the checkers as shown in FIG. 1.

With reference to FIG. 12, heat conversion equipment or devices 140 are positioned outside the furnace walls to use the heat as is, or to convert the heat to another form of energy, e.g. electrical or mechanical energy. The equipment 140 is placed over the end 64 of one of the heat pipes, e.g. the heat pipe 102 to transfer heat from the heat pipe to the equipment 140. As is appreciated, the invention is not limited to the equipment 140 and can include, but is not limited to electrical and mechanical equipment such as thermoelectric devices, and sterling engines to name a few. In one non-limiting embodiment of the invention the equipment to be heated is a thermoelectric module, e.g. but not limiting to the invention, a Global Thermoelectric cylinder TEG (model 7-120) having a hot face which is a cylinder having a 3.5 inch diameter and a cold face which is a cylinder of larger diameter having a water cooled jacket over the cold face, or the equipment 140 can be a modified embodiment of the thermoelectric device disclosed in U.S. patent application Ser. No. 11/958,565 filed even date in the name of Adam D. Polcyn and titled "A DEVICE FOR USE IN A FURNACE EXHAUST STREAM FOR THERMOELECTRIC GENERATION." More particularly, with reference to FIG. 13, thermoelectric device 146 a modified embodiment of the thermoelectric device disclosed in U.S. patent application Ser. No. 11/958,565 includes an inner hollow conduit 148 to place over the cold end 64 of a heat pipe. A plurality of thermoelectric cells 150 are positioned between the inner conduit and an outer conduit 152. The outer conduit 152 has an inner wall 154 spaced from an outer wall 156 by a pair of spacers 158 to provide the outer conduit with an inlet chamber 160 and an outlet channel 162 to move a cooling medium, e.g. chilled water through the outer conduit 152 to cool the thermoelectric modules 150. The equipment 140 in this case is the thermoelectric cylinder or the thermoelectric device 146 connected to an electric load, e.g. a motor or lights. As the heat is extracted from the heat pipe, the thermoelectric cylinder or thermoelectric device generates electricity to power a motor and/or lights.

With reference to FIG. 14, the invention contemplates mounting the equipment on more than one heat pipe. For example and not limiting to the invention, FIG. 14 shows the cold end 64 of three heat pipes, e.g. the heat pipes 104-106 shaped to be in contact with one another and the equipment 140 mounted on the end 64 of the three pipes. As can be appreciated, the invention is not limited to the number of heat pipes that have their cold ends joined together. With reference to FIG. 15, the invention further contemplates providing a heat pipe, e.g. heat pipe 170 with two cold ends 64 with equipment 140 mounted on each of the cold ends of the heat pipe 170. The invention is not limited to the number of coed ends that can be joined together or the number of cold ends a heat pipe can have. For example 2 or more cold ends can be joined together and a heat pipe can have two or more cold ends.

As discussed above particles in the exhaust gases may accumulate between the heat pipes. One way to minimize clogging of the space between the heat pipes is to increase the spacing between the heat pipes. In another non-limiting embodiment of the invention, pressurized air can be used to remove particles between the heat pipes. In one non-limiting embodiment of the invention, a pressured air line can be moved into the exhaust flue and moved over the array of heat pipes to blow out any particles between the heat pipes.

As can be appreciated, the invention is not limited to the embodiments of the invention discussed herein, and the scope of the invention is only limited by the scope of the following claims.

What is claimed is:

1. An arrangement for transferring heat from a first position located in a passageway defined by inner surface of a wall to a second position located adjacent outer surface of the wall, the arrangement comprising:
   an array of a plurality of elongated heat pipes mounted in the wall, each of the heat pipes having a first end in the first position and an opposite second end in the second position, wherein the plurality of elongated heat pipes of the array are maintained in fixed relationship to one another by a connection selected from the group comprising:
   A. a plurality of heat conducing strips, each of the strips having a first end and an opposite second end with the first end of the strips contacting outer surface of a first one of the plurality of elongated heat pipes of the array and the second end of the strips contacting outer surface of a second one of the plurality of elongated heat pipes of the array, wherein the plurality of strips contacting the first one and the second one of the plurality of elongated heat pipes of the array are spaced from one another, and
   B. the first end of each of the plurality of elongated heat pipes of the array secured to a surface of a thermal conducting plate member to maintain the first end of the plurality of elongated heat pipes of the array in a fixed relationship to one another.

2. The arrangement according to claim 1 further comprising heat conversion equipment connected to the second end of selected ones of the plurality of heat pipes of the array.

3. The arrangement according to claim 2, wherein the second end of at least two of the plurality of the heat pipes of the array are in contact with one another and the heat conversion equipment is over the second end of the at least two heat pipes of the array.

4. The arrangement according to claim 2 wherein the second end of one of the heat pipes of the array has a bifurcated second end with the heat conversion equipment on each one of the bifurcated second end.

5. The arrangement according to claim 1 wherein a heated medium is to be moved through the passageway in a predetermined direction, and wherein space between selected ones of the elongated heat pipes of the array lies in a plane transverse to the predetermined direction in which the heated medium is to be moved.

6. The arrangement according to claim 5 wherein the passageway is an exhaust passageway of a furnace, and the heated medium is exhaust gases of the furnace, and comprising a first conduit for moving a gas mounted upstream of the array of the plurality of elongated heat pipes and a second conduit for moving gas mounted downstream of the array of the plurality of elongated heat pipes, wherein the upstream and the downstream locations of the conduits is relative to the predetermined direction in which the heated medium is to be moved.

7. The arrangement according to claim 1 wherein the plurality of elongated heat pipes of the array are arranged in rows and columns with at least two heat pipes in each row and at least two heat pipes in each column, and the first end of the plurality of the heat pipes of the array spaced from one another.

8. The arrangement according to claim 7 wherein the array has at least three columns of heat pipes with a selected row of the array between outermost rows of the array having fewer heat pipes than at least one of the outermost rows of the array.

9. The arrangement according to claim 8,
wherein the fixed relationship is a fixed spaced relationship and the plurality of the elongated heat pipes of the array are maintained in the fixed relationship by the connection of group A, and
wherein a heated gas is to be moved through the passageway in a predetermined direction, and the space between selected ones of the plurality of strips lies in a plane transverse to the predetermined direction of the heated gas to be moved through the passageway.

10. The arrangement according to claim 1, wherein the plurality of the elongated heat pipes of the array are maintained in the fixed relationship by the group B connection and longitudinal axis of selected ones of the plurality of the elongated heat pipes of the array and the surface of the thermal conducting plate member subtend an acute angle.

11. The arrangement according to claim 1,
wherein a heated gas is to be moved through the passageway in a predetermined direction, and the inner surface of the wall defines a cross sectional area generally normal to the predetermined direction in which the heated gas is to be moved, and portion of the array in the passageway is immediately downstream of the cross sectional area,
wherein each of the plurality of the heat pipes of the array are spaced from one another a distance not less than $\frac{1}{16}$ inch (0.16 centimeter) to avoid trapping particles between the heat pipes of the array.

12. The arrangement according to claim 11 further comprising a member in the passageway on a side of the array and acting on the heated gas to be moved through the array to increase the flow of the heated gas to be moved through the array.

13. An arrangement for transferring heat from a furnace, wherein the furnace comprises a heating chamber for melting glass batch materials, the heating chamber comprising a first side and an opposite second side; a first passageway having a first open end and a second open end; a first port at the first side, and a second port at the second side, of the heating chamber, and a second passageway having a first open end and a second open end, wherein the first port connects the first open end of the first passageway to the heating chamber; the second port connects the first open end of the second passageway to the heating chamber, and the second open ends of the first and second passageways are accessible to the environment, the arrangement comprising:
an array of a plurality of elongated heat pipes mounted in a wall of the furnace to position a first end of the plurality of heat pipes in one of the first and the second passageways of the furnace and opposite second end of the plurality of heat pipes outside the furnace, wherein the heat pipes are spaced from one another and selected ones of the plurality of the heat pipes of the array are interconnected to one another by spaced elongated members, wherein heated exhaust gases are to be moved through the first and the second passageways in a predetermined direction, and wherein the space between selected ones of the elongated heat pipes lies in a plane transverse to the predetermined direction of the heated exhaust gases.

14. The arrangement according to claim 13 wherein the furnace is a regenerative furnace, and the first and the second passageways have checkers to remove heat from the exhaust gases moving from the first open ends of the first and second passageways toward the second open ends of the first and second passageways, and to heat combustion gas moving to the first ends of the first and second passageways.

15. A method of transferring heat from exhaust system of a furnace to a position outside of the exhaust system, comprising:
mounting an array of a plurality of heat pipes in a furnace wall with first end of the array in the exhaust system and opposite second end of the array outside the exhaust system, wherein the array has a first side and an opposite second side;
moving heated exhaust gases along a flow path through the exhaust system toward the first side of the array, through the first side of the array, through the array and out of the second side of the array to heat the second end of the plurality of heat pipes of the array;
at the second side of the array, moving air in the same direction as the flow path of the exhaust gases to pull the exhaust gases through the array, and
removing heat from the second end of the plurality of the heat pipes of the array.

16. The method according to claim 15 comprising the first side of the array moving air in the same direction as the flow path of the exhaust gases to bias the exhaust gases into the first side of the array and through the array.

17. The method according to claim 15 further comprising converting the heat removed from the second end of the array to mechanical and/or electrical energy.

18. A heat transfer device, comprising:
an array of a plurality of elongated heat pipes, each of the heat pipes having a first end and an opposite second end, wherein the plurality of elongated heat pipes of the array are maintained in a fixed relationship to one another by a connection comprising:
the first end of each of the plurality of elongated heat pipes of the array secured to a surface of a thermal conducting plate member to maintain the first end of the plurality of elongated heat pipes of the array in a fixed relationship to one another, wherein longitudinal axis of selected ones of the plurality of the elongated heat pipes of the array and the surface of the thermal conducting plate member subtend an acute angle.

* * * * *